United States Patent
Li et al.

(10) Patent No.: US 6,424,003 B2
(45) Date of Patent: *Jul. 23, 2002

(54) EEPROM CELL WITH SELF-ALIGNED TUNNELING WINDOW

(75) Inventors: Xiao Yu Li; Sunil D. Mehta, both of San Jose; Christopher O. Schmidt, Sunnyvale, all of CA (US)

(73) Assignee: Lattice Semiconductor Corporation, Hillsboro, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 53 days.

(21) Appl. No.: 09/169,492

(22) Filed: Oct. 9, 1998

(51) Int. Cl.$^7$ .............................................. H07L 29/788
(52) U.S. Cl. ...................................... 257/318; 257/321
(58) Field of Search ............................... 257/318–321; 438/263, 264

(56) References Cited

U.S. PATENT DOCUMENTS

| | | | |
|---|---|---|---|
| 4,924,278 A | 5/1990 | Logie | |
| 5,844,269 A | * 12/1998 | Kuo | 257/315 |
| 5,917,215 A | * 6/1999 | Chuang et al. | 257/315 |
| 5,953,254 A | * 9/1999 | Pourkeramati | 257/321 |

FOREIGN PATENT DOCUMENTS

JP        8-097302      * 4/1996

* cited by examiner

Primary Examiner—David Hardy
(74) Attorney, Agent, or Firm—Davis Chin

(57) ABSTRACT

An improved EEPROM cell with a self-aligned tunneling window is provided which is fabricated by a standard STI process so as to produce a smaller layout size and a reduced cell height. The EEPROM cell includes a floating gate, a programmable junction region, and a tunneling oxide layer separating the programmable junction region and the floating gate. The length dimension of the floating gate is less than the length dimension of the tunneling window so that the tunneling window is overlapping the floating gate. The tunneling window is self-aligned by edges forming the length dimension of the floating gate so as to form a self-aligned tunneling window.

20 Claims, 4 Drawing Sheets

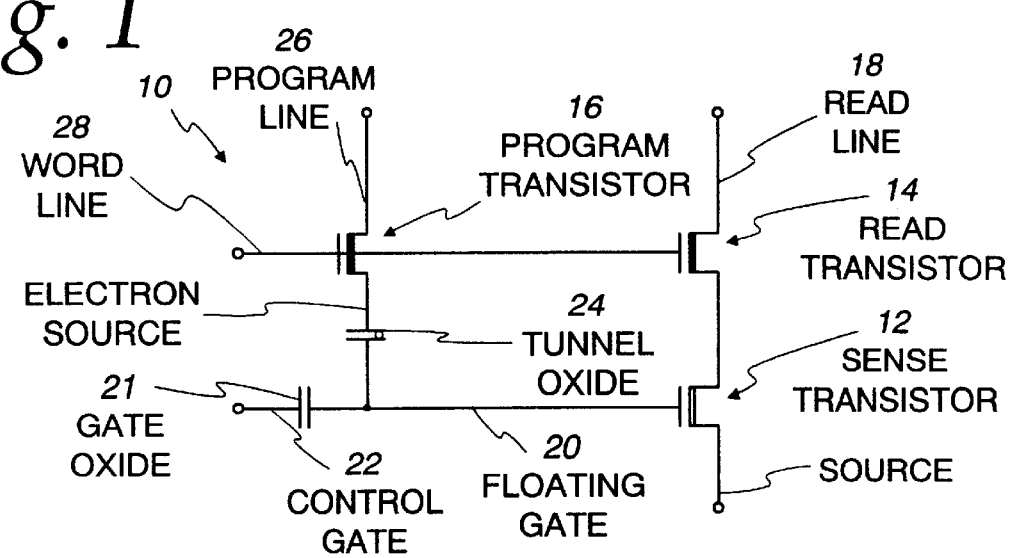
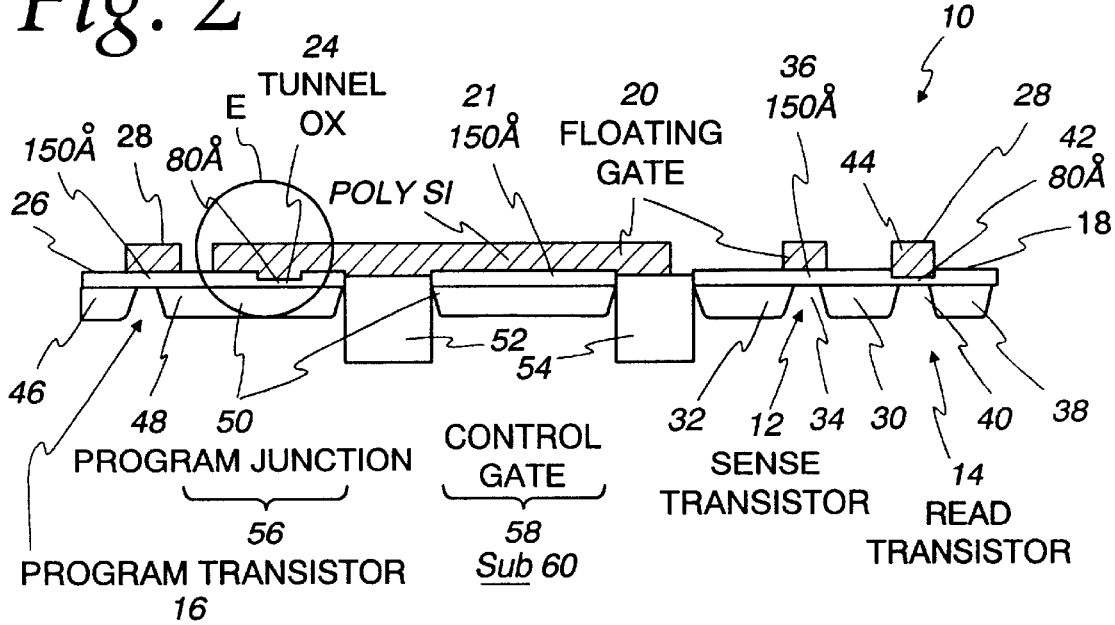

EEPROM CELL WITH SELF-ALIGNED TUNNELING WINDOW

BACKGROUND OF THE INVENTION

1. Field of the Invention

This invention relates generally to electrically, erasable programmable read-only memory (EEPROM) cells for use in complex programmable logic device (CPLD) technology. More particularly, it relates to an improved EEPROM cell having a self-aligned tunneling window which permits smaller layout size, lower programming and erasing voltages, and reduced manufacturing costs.

2. Description of the Prior Art

As is generally known, EEPROM cells have been widely used in recent years in complex programmable logic devices (CPLDs). Most conventional EEPROM cells include three transistors consisting of a Program or Write transistor, a Read transistor, and a Sense transistor. The programming and erasing of the sense transistor is performed through a tunneling window by using a high voltage. In order to prevent breakdown of the sense transistor being operated in such a high voltage environment, the gate oxide thereof is required to be relatively thick on the order of 150–200 Å. In addition, since the gates of both the Program transistor and Read transistor are generally connected together and further joined to a wordline, which also has applied thereto a high voltage, the gate oxide thickness of the Read transistor must also be made relatively thick (i.e., 150–200 Å).

Further, in view of the trend of manufacturing integrated circuit memory devices with higher and higher densities, there exists a continuing need of scaling-down (reducing component size) of the transistors in order to have smaller and smaller memory cells. However, due to the fact that conventional EEPROMs require transistors having relatively thick oxide layers, effective scaling down of the conventional EEPROM devices cannot be achieved. Moreover, the EEPROM devices commonly require the formation of tunnel capacitors which include tunnel oxide layers on the substrate. Such tunnel oxide layers usually cannot be scaled down in thickness because significant endurance and data retention problems arise when the tunnel oxide layers are made too thin. As a result, there is also created a limitation on increasing the speed of the programming and erasing operations performed on the EEPROM based CPLDs.

Such a typical prior art EEPROM of the aforementioned type is described and illustrated in U.S. Pat. No. 4,924,278 to Stewart Logie and entitled "EEPROM Using Merged Source and Control Gate." This '278 patent is assigned to the same assignee as in the present invention and is hereby incorporated by reference. In FIG. 2 of the '278 patent, there is shown a structure for an EEPROM memory cell 10 utilizing a single poly-Si floating gate 38. The poly-Si floating gate is capacitively coupled to a source of the sense transistor 30 via gate oxide layer 37 (approximately 300 Å in thickness) and is also capacitively coupled to source 34 of the write transistor 20 via tunnel oxide layer 55 (approximately 90 Å in thickness).

Therefore, it would be desirable to provide an improved EEPROM cell which permits a smaller layout size, can be programmed and erased using a lower voltage than the conventional EEPROM cell, and can be scaled down so as to reduce cell height and cell parasitic capacitance. Further, it would be expedient that the improved EEPROM cell be relatively easier and less costly to manufacture and assemble.

SUMMARY OF THE INVENTION

Accordingly, it is a general object of the present invention to provide an improved EEPROM cell having a self-aligned tunneling window which overcomes the problems of the prior art.

It is an object of the present invention to provide an improved EEPROM cell having a self-aligned tunneling window which can be manufactured at relatively lower costs due to the use of a non-critical layer mask for the tunneling window.

It is another object of the present invention to provide an improved EEPROM cell which has a higher coupling ratio than the conventional EEPROM cell so as to allow scaling-down of the cell layout size.

It is still another object of the present invention to provide an improved EEPROM cell which is scalable so as to reduce cell height and cell parasitic capacitance.

It is yet still another object of the present invention to provide an improved EEPROM cell which has a higher injection efficiency than the conventional EEPROM cell so as to allow use of lower programming and erasing voltages.

In accordance with a preferred embodiment of the present invention, there is provided an EEPROM cell which includes a floating gate, a programmable junction region, and a tunneling oxide layer separating the programmable junction region and the floating gate. The tunneling oxide layer defines a tunneling window which allows for programming and erasing of the floating gate by tunneling electrons therethrough. The programmable junction region has a width dimension and length dimension so as to define a first area. The tunneling window has a width dimension and a length dimension so as to define a second area. The floating gate has a width dimension and a length dimension so as to form a third area.

The width dimension of the tunneling window is made greater than the width dimension of the programmable junction region so as to overlap the programmable junction region. The length dimension of the tunneling window is made to be less than the length of the programmable junction region so as to be confined within the length dimension of the programmable junction region. The length dimension of the floating gate is made to be less than the length dimension of the tunneling window so that the tunneling window is overlapping the floating gate. The width dimension of the floating gate is made to be larger than the width dimension of the tunneling window so that the floating gate is overlapping the tunneling window. As a result, the tunneling window is self-aligned by edges forming the length dimension of the floating gate so as to form a self-aligned tunneling window.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a schematic circuit diagram of a conventional EEPROM cell;

FIG. 2 is a cross-sectional view of the EEPROM cell of FIG. 1;

DESCRIPTION OF THE PREFERRED EMBODIMENT

Before describing in detail the improved EEPROM cell with a self-aligned tunneling window of the present invention, it is believed that it would be helpful in understanding the principles of the present invention and to serve as a background by first explaining the structure of the conventional EEPROM cell with its tunneling window with reference to FIGS. 1 through 5. Therefore, the conventional EEPROM cell structure will now be explained and the problems associated therewith.

Figure 3:
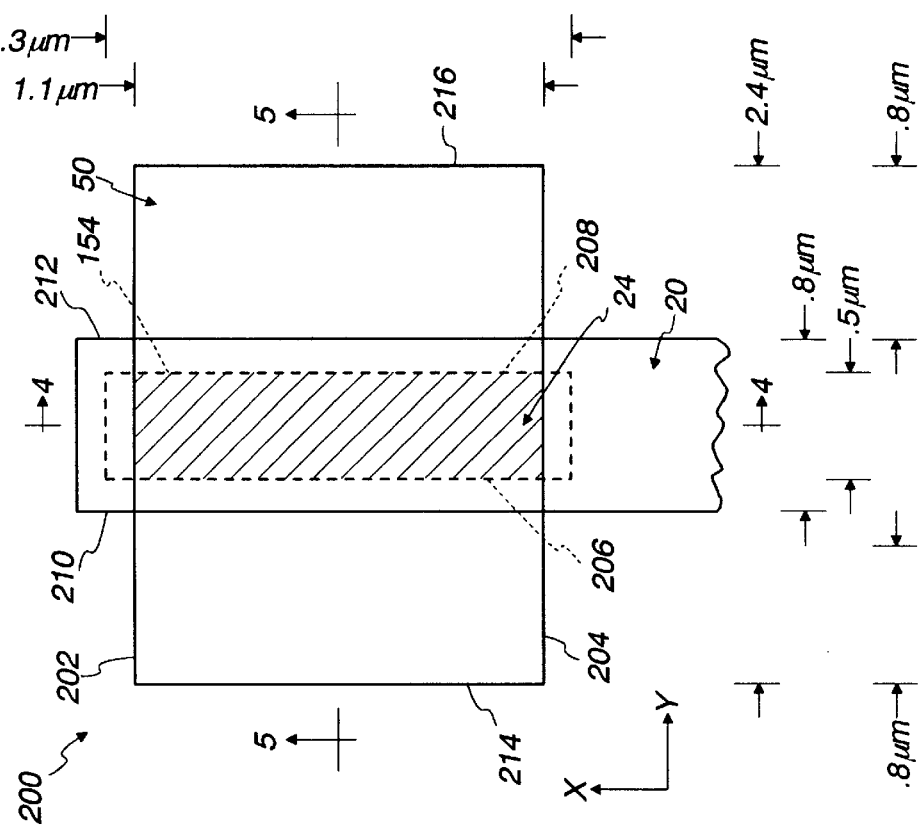
FIG. 3 is an enlarged top plan view of the encircled portion E of FIG. 2, illustrating the conventional tunneling window in the EEPROM cell.
Figure 4:
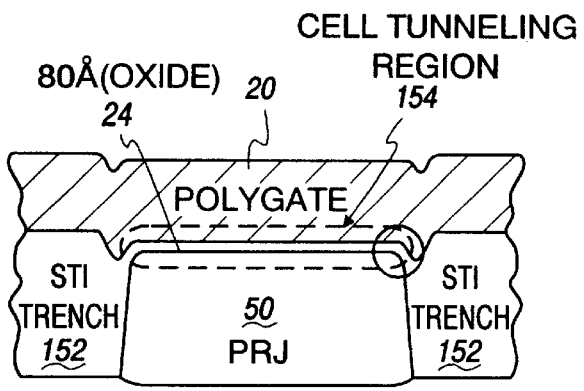
FIG. 4 is a cross-sectional view, taken along the lines 4—4 of FIG. 3.
Figure 5:
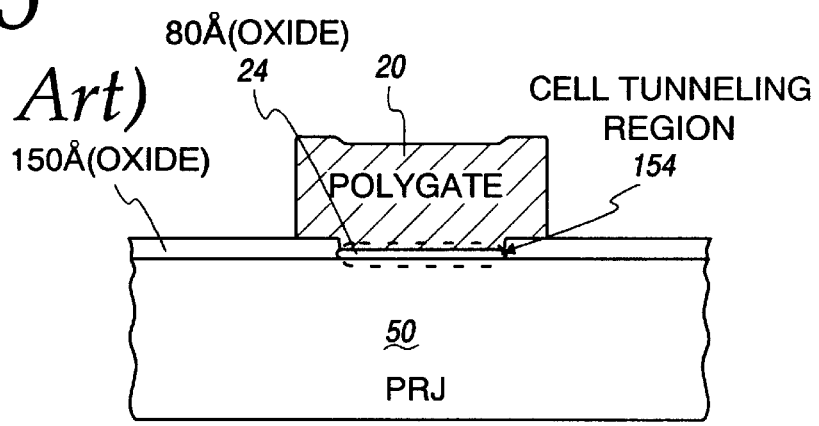
FIG. 5 is a cross-sectional view, taken along the lines 5—5 of FIG. 3.

Initially, there is shown in FIG. 1 a schematic circuit diagram of a conventional EEPROM cell 10 which is quite similar to the prior art EEPROM cell described and illustrated in FIGS. 2 and 3 of the aforementioned '278 patent. A cross-sectional view of the construction of the EEPROM cell structure 10 of FIG. 1 is illustrated in FIG. 2. FIG. 3 is an enlarged, top plan view of the encircled portion E of FIG. 2, which illustrates the layout of the tunneling window in the conventional EEPROM cell 10. FIG. 4 is a cross-sectional view taken along the lines 4—4 of FIG. 3, and FIG. 5 is a cross-sectional view taken along the lines 5—5 of FIG. 3.

As can best be seen from FIG. 1, the EEPROM cell 10 is comprised of a floating gate sense transistor 12, a read transistor 14, and a program or write transistor 16. The read transistor has its drain connected to a Read line 18 and its source connected to the drain of the sense transistor 12. The sense transistor has its floating gate 20 capacitively coupled via a gate oxide 21 to a Control Gate line 22 and also capacitively coupled via a tunneling oxide 24 to the source of the program transistor 16. The program transistor 16 has its drain connected to a Program line 26 and its gate connected to the gate of the read transistor 14 and to a Word line 28.

With reference to FIG. 2, the EEPROM cell 10 is fabricated with the floating gate sense transistor 12 being formed by a N+ drain region 30 and a N+ source region 32, and a channel region 34 disposed between the drain and source regions. A gate oxide layer (approximately 150 Å in thickness) is formed above the channel, and an N-type polycrystalline silicon (poly-Si) floating gate 20 is formed over the gate oxide 36. The read transistor 14 is formed with a N+ drain region 38 and the N+ source region 30 with a channel region 40 disposed therebetween. A gate oxide layer 42 (approximately 80 Å in thickness) and a gate structure 44 are formed over the channel region 40. The program transistor 16 is formed with a N+ drain region 46, a N+ source region 48, and a programmable junction region 50.

The tunneling oxide layer 24 is formed between the programmable junction region 50 (source or the region 48 of the program transistor 16) and the poly-Si floating gate 20. The gate oxide 21 is formed between the floating gate 20 and the Control Gate line 22. The gate oxide layer 21 is approximately 150 Å in thickness. Areas 52 and 54 define isolation regions in which the shallow trench isolation structures will be located. The shallow trench isolation structures formed in the areas 52 and 54 are used to electrically isolate active regions 56 and 58 of the semiconductor substrate 60 from the surrounding devices.

As can best be seen from FIGS. 3–5, the tunnel window structure 200 consisting of the tunneling window defined by the tunneling oxide layer 24 has a dimension in the X-direction on the order of 1.3 μm to 1.5 μm which overlaps edges 202 and 204 of the active region formed by the programmable junction region 50. It will be noted that the shallow trench isolation (STI) trenches 152 (FIG. 4) are formed on each side of the programmable junction region 50 so as to electrically isolate the same. It should be further noted that the EEPROM cell is programmed and erased by the tunneling of electrons through the tunneling window. Moreover, the tunneling window has a dimension in the Y-direction of approximately 0.5 μm. The poly-Si floating gate 20 has a dimension in the Y-direction of about 0.8 μm and thus overlaps the edges 206 and 208 of the tunneling window 24 in the Y-direction by approximately 0.15 μm on each side thereof.

As presently illustrated, the tunneling window 24 is about 1.3 μm×0.5 μm with approximately 0.1 μm overlap on each side of the active region in the X-direction. Further, the distances between the edges 210, 212 of the poly-Si floating gate 20 and the corresponding ends 214, 216 of the active region 50 in the Y-direction are approximately 0.8 μm. Accordingly, the cell height defined by the distance in the Y-direction of the active region 50, assuming a symmetrical cell, is approximately 2.4 μm. As a result, the actual size of the tunneling region designated by the dotted line 154 lying over the programmable junction region 50 and underneath the floating gate 20 is 1.1 μm×0.5 μm.

While it would be desirable to reduce the dimension of the tunneling window 24 in the Y-direction to be even less than 0.5 μm this is not very practical since the process for forming the tunneling window with the standard 0.5 μm dimension already requires a very critical layer mask that is expensive to manufacture. Further, since the tunneling window is typically opened using a wet etch such as hydrochloric acid buffered oxide etch (BOE), it is very difficult to insure that such a small-size tunneling window can be reliably opened. While it is known that a dry plasma etch may be used to form the small-size tunneling window, this process is not acceptable because it creates a substantial amount of damage to the tunneling oxide thereby causing degraded cell data retention. Consequently, the current limitation on the tunneling window dimension is 0.5 μm.

Figure 7:
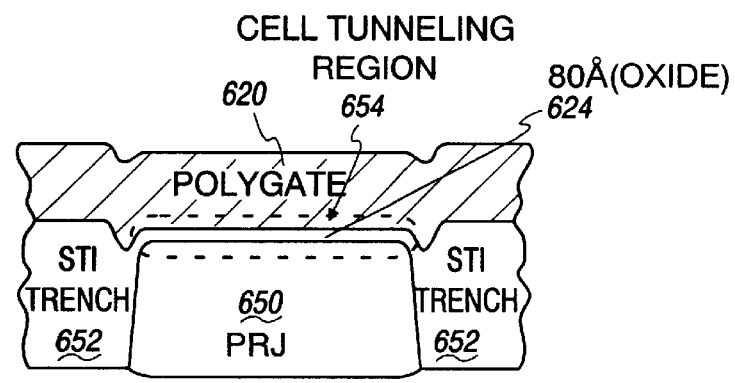
FIG. 7 is a cross-sectional view, taken along the lines 7—7 of FIG. 6.
Figure 8:
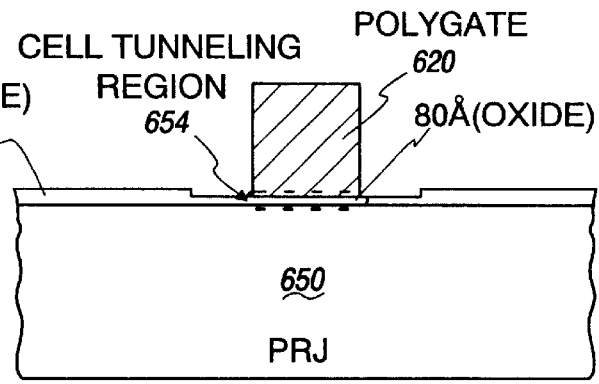
FIG. 8 is a cross-sectional view, taken along the lines 8—8 of FIG. 6.

In view of this, the inventors have now discovered a new and improved EEPROM cell which can be fabricated using the standard logic STI process, but yet is less expensive to manufacture due to the use of a non-critical layer mask for the tunneling window. This is achieved in the present invention by fabricating the EEPROM cell to have a self-aligned tunneling window. The tunneling window structure 600 of the present invention will now be explained with reference to FIGS. 6 through 8.

The tunneling window structure 600 is comprised of a tunneling window defined by the tunneling oxide layer 624 which has a dimension in the X-direction in the range between 1.2 μm to 1.4 μm and is preferably about 1.3 μm. Thus, the dimension in the X-direction of the tunneling window 624 is the same as the tunneling oxide layer 24 in FIGS. 3–5 and has not been reduced. As can be seen, the tunneling oxide layer 624 in the X-direction overlaps edges 602 and 604 of the active region formed by the programmable junction region 650. It will be noted that the shallow trench isolation (STI) trenches 652 (FIG. 7) are formed on each side of the programmable junction region 650 so as to electrically isolate the same. Again, the tunneling window 624 allows for programming and erasing of the floating gate 620 by tunneling electrons therethrough.

However, the dimension of the tunneling window 624 has only been increased in the Y-direction to be approximately in the range between 0.65 μm and 0.85 μm and is preferably about 0.75 μm. Since the dimensions of the tunneling window in both the X and Y directions are larger than 0.5 μm, a non-critical layer mask can now be used to form the same which will reduce manufacturing costs. Further, this insures that the tunneling window 624 can be reliably opened by using the wet etching process.

It will be noted that the tunneling window 624 in the Y-direction is self-aligned by the edges 610, 612 defining the length of the poly-Si floating gate 620. Since the length dimension of the floating gate in the Y-direction is scalable, this permits the cell height to be reduced. As a result, the parasitic capacitance of the cell is reduced, thereby increasing the reading speed of operation. In particular, the floating gate 620 has a dimension in the Y-direction in the range of 0.18 μm to 0.35 μm and is most preferably 0.35 μm. This is unlike the conventional cell tunneling window 24 of FIG. 3, which is not scalable below the dimension of 0.5 μm.

With the length of the poly-Si floating gate in the Y-direction being reduced to 0.35 μm, the tunneling window 624 overlaps the edges 610, 612 of the floating gate by approximately 0.20 μm on each side thereof. Further, the edges 614, 616 of the active region 650 in the Y-direction overlaps edges 606, 608 of the tunneling window 624 by approximately 0.6 μm on each side thereof. Again, assuming a symmetrical cell, it can be seen that the cell height (dimension in the Y-direction of the programmable junction region 650) has been reduced to approximately 1.95 μm and thus lowers the cell parasitic capacitance.

Figure 6:
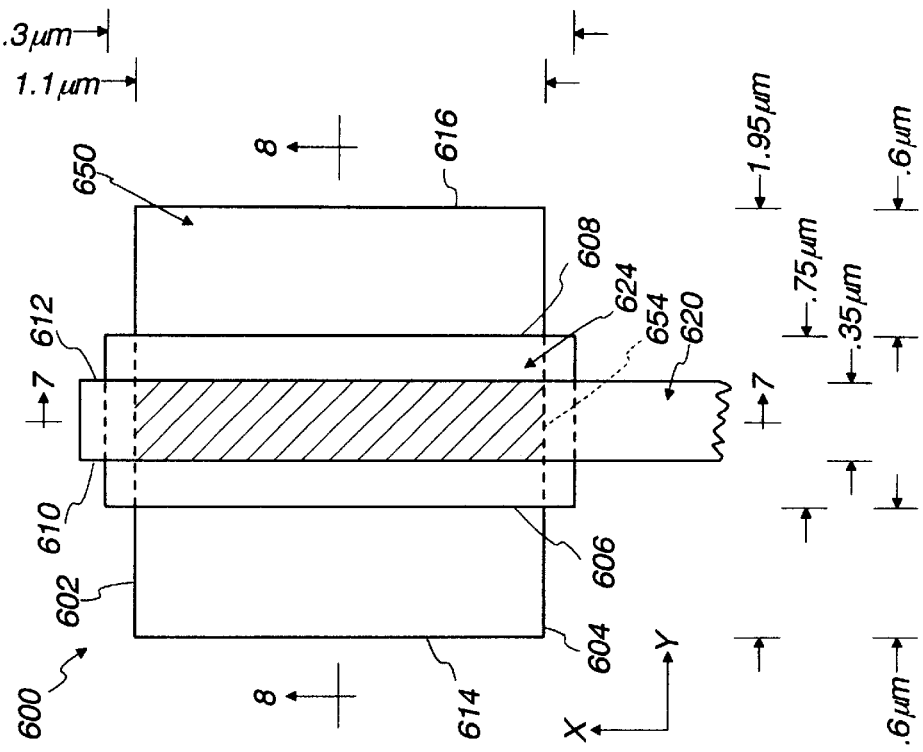
FIG. 6 is an enlarged top plan view similar to FIG. 3, but illustrating the self-aligned tunneling window constructed in accordance with the principles of the present invention.

As a result, the dimensions of the tunneling window 624 in the preferred embodiment is approximately 1.3 μm×0.75 μm. However, the actual size of area of the tunneling window region designated by the dotted line 654 lying over the active region 650 and underneath the floating gate 620 is now only 1.1 μm×0.35 μm. This area designated by the dotted line 654 in FIG. 6 is smaller than the area of the tunneling window region designated by the dotted line 154 in FIG. 3 lying over the active region 50 and underneath the poly gate 20 (1.1 μm×0.8 μm).

As the size or area of the tunneling window region is made smaller, the coupling ratio of the cell is increased. Coupling ratio defines what portion of an applied voltage will appear across the tunneling oxide layer. This is, in turn, dependent upon the total capacitance of the cell which includes the capacitances of the control gate and the tunneling window region as well as parasitic capacitance. The coupling ratio is inversely proportional to the total cell capacitance. Therefore, the smaller capacitance of the smaller-area tunneling window region will create a larger coupling ratio.

Capacitance C can be calculated by the generally well-know equation as follows:

$$C = AK\epsilon_0/t$$

where:
$\epsilon_0$=permittivity in vacuum (8.85×10$^{-14}$ F/cm)
K=dielectric constant of material
A=area of material
t=thickness of dielectric Thus, the coupling ratio can be made higher by reducing the area of the tunneling window region. This higher coupling ratio allows the scaling down of the cell layout size. Further, since the tunneling window region now becomes scalable, the cell height can be reduced and thus lowers the parasitic capacitance of the cell.

The improved EEPROM cell having a self-aligned tunneling window was found to have a larger erase threshold voltage than expected based upon calculations of the erase coupling ratio. This is believed to be caused by the high electric field at the edges 610, 612 in the Y direction of the floating gate 620 and thus produced a higher injection efficiency. As a result, the higher injection efficiency permits the use of lower voltages during the programming and erasing operations.

Figure 9:
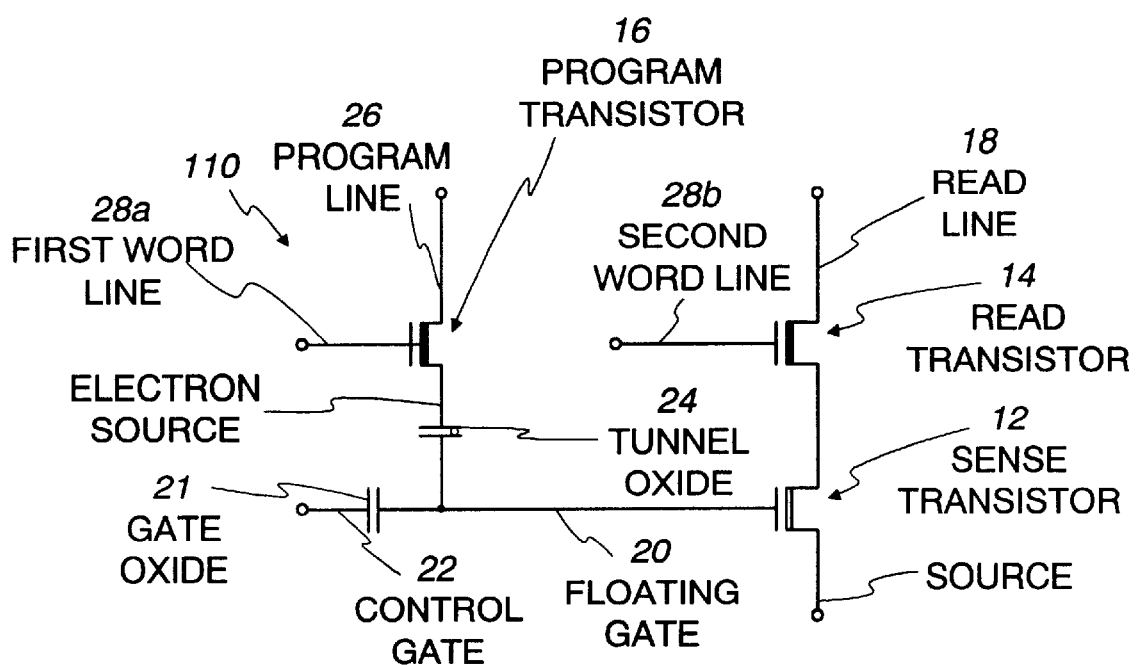
FIG. 9 is a schematic circuit diagram of an improved EEPROM cell, of the present invention.

In FIG. 9, there is shown a schematic circuit diagram of the improved EEPROM cell 110 of the present invention. It will be noted that the EEPROM cell 110 is substantially identical to the conventional EEPROM cell 10 of FIG. 1, except that there are provided two separate wordlines. Unlike the conventional EEPROM cell 10 having a wordline 28 connected to both control gates of the respective program and read transistors, the control gate of the program transistor 16 is connected to a first wordline 28a, and the control gate of the read transistor 14 is connected to a second wordline 28b in FIG. 9. This permits the gate oxide thickness of the read transistor 14 to be reduced (about 80 Å), thereby increasing the reading speed over the conventional EEPROM cell.

From the foregoing detailed description, it can thus be seen that the present invention provides an improved EEPROM cell having a self-aligned tunneling window which can be fabricated by the standard logic STI process but yet is less expensive to manufacture due to the use of a non-critical layer mask for the tunneling window. The EEPROM cell includes a floating gate, a programmable junction region, and a tunneling oxide layer separating the programmable junction region and the floating gate. The length dimension of the floating gate is less than the length dimension of the tunneling window so that the tunneling window is overlapping the floating gate. The tunneling window is self-aligned by edges forming a length dimension of the floating gate so as to form a self-aligned tunneling window.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In an EEPROM cell including a floating gate, a programmable junction region, and a tunneling oxide layer separating said programmable junction region and said floating gate, said tunneling oxide layer defining a tunneling window which allows for programming and erasing of said floating gate by tunneling electrons therethrough, wherein the improvement comprising:

said programmable junction region having a width dimension and length dimension so as to define a first area;

said tunneling window having a width dimension and a length dimension so as to define a second area;

said floating gate having a width dimension and a length dimension so as to define a third area;

said width dimension of said tunneling window being greater than said width dimension of said programmable junction region so as to overlap said programmable junction region;

said length dimension of said tunneling window being less than said length dimension of said programmable junction region so as to be confined within the length dimension of said programmable junction region;

said length dimension of said floating gate being less than said length dimension of said tunneling window so that said tunneling window is overlapping said floating gate; and said width dimension of said floating gate being larger than said width dimension of said tunneling window so that said floating gate is overlapping said tunneling window, whereby said tunneling window is self-aligned by edges formed said length dimension of said floating gate so as to form a self-aligned tunneling window.

2. In an EEPROM cell as claimed in claim 1, wherein said length dimension of said tunneling window is in the range between 0.65 μm and 0.85 μm.

3. In an EEPROM cell as claimed in claim 2, wherein said width dimension of said tunneling window is approximately 1.3 μm.

4. In an EEPROM cell as claimed in claim 3, wherein said length dimension of said floating gate is in the range between 0.18 μm and 0.35 μm.

5. In an EEPROM cell as claimed in claim 4, wherein said length dimension of said tunneling window is preferably 0.75 μm.

6. In an EEPROM cell as claimed in claim 5, wherein said length dimension of said floating gate is preferably 0.35 μm.

7. In an EEPROM cell as claimed in claim 6, wherein said length dimension of said tunneling window overlaps said length dimension of said floating gate on each side by 0.20 μm.

8. In an EEPROM cell as claimed in claim 7, wherein said length dimension of said programmable junction region overlaps said length dimension of said tunneling window by 0.6 μm on each side.

9. In an EEPROM cell including a floating gate, a programmable junction region, and a tunneling oxide layer separating said programmable junction region and said floating gate, said tunneling oxide layer refining a tunneling window which allows for programmable and erasing of said floating gate by tunneling electrons therethrough, wherein the improvement comprising:

said tunneling window having a width dimension and a length dimension;

said floating gate having a width dimension and a length dimension;

said length dimension of said floating gate being less than said length dimension of said tunneling window so that said tunneling window is overlapping said floating gate; and the portion of said tunneling window lying underneath said floating gate defining a tunneling window region.

10. In an EEPROM cell as claimed in claim 9, wherein said tunneling window region has a length dimension in the range of 0.18 μm to 0.35 μm.

11. In an EEPROM cell as claimed in claim 9, wherein said tunneling window region has a width dimension of approximately 1.1 μm.

12. In an EEPROM cell as claimed in claim 9, wherein said length dimension of said tunneling window is in the range of 0.65 μm to 0.85 μm.

13. In an EEPROM cell as claimed in claim 9, wherein said floating gate has opposing edges defining its length dimension, and said tunneling window overlaps both floating gate edges.

14. In an EEPROM cell as claimed in claim 9, wherein said width dimension of said tunneling window is approximately 1.3 μm.

15. In an EEPROM cell as claimed in claim 9, wherein said length dimension of said floating gate is in the range between 0.18 μm to 0.35 μm.

16. In an EEPROM cell as claimed in claim 15, wherein said length dimension of said floating gate is approximately 0.35 μm.

17. In an EEPROM cell including a floating gate, a programmable junction region, and a tunneling oxide layer separating said programmable junction region and said floating gate, said tunneling oxide layer defining a tunneling window which allows for programming and erasing of said floating gate by tunneling electrons therethrough, wherein the improvement comprising:

said programmable junction region having a width dimension and length dimension so as to define a first area;

said tunneling window having a width dimension and a length dimension so as to define a second area;

said floating gate having a width dimension and a length dimension so as to define a third area;

said width dimension of said tunneling window being greater than said width dimension of said programanble junction region so as to overlap said programmable junction region;

said length dimension of said tunneling window being less than said length dimension of said programmable junction region so as to be confined within the length dimension of said programmable juction region;

said length dimension of said floating gate being less than said length dimension of said tunneling window so that said tunneling window is overlapping said floating gate;

said width dimension of said floating gate being larger than said width dimension of said tunneling window so that said floating gate is overlapping said tunneling window; and said length dimension of said programmable junction region defining a height of said EEPROM cell.

18. In an EEPROM cell as claimed in claim 17, wherein said length dimension of said programmable junction region is less than 2.4 μm.

19. In an EEPROM cell as claimed in claim 18, wherein said length dimension of said programmable junction region is less than 1.95 μm.

20. In an EEPROM cell as claimed in claim 17, wherein said length dimension of said programmable junction region overlaps said length dimension of said tunneling window by 0.6 μm on each side.

* * * * *

UNITED STATES PATENT AND TRADEMARK OFFICE
CERTIFICATE OF CORRECTION

PATENT NO.     : 6,424,003 B2
DATED          : July 23, 2002
INVENTOR(S)    : Li et al.

It is certified that error appears in the above-identified patent and that said Letters Patent is hereby corrected as shown below:

<u>Column 7,</u>
Line 53, "refining a tunneling" should be -- defining a tunneling .
Line 54, "programmable and" should be -- programming and --.

<u>Column 8,</u>
Line 9, "0.65 μm to 0.85 μm" should be -- 0.65 μm and 0.85 μm --.
Line 19, "0.18 μm to 0.35 μm" should be -- 0.18 μm and 0.35 μm --.
Lines 37-38, "programmanble" should be -- programmable --.

Signed and Sealed this

Twenty-eighth Day of January, 2003

JAMES E. ROGAN
*Director of the United States Patent and Trademark Office*